United States Patent
Chou et al.

(10) Patent No.: US 12,355,450 B2
(45) Date of Patent: Jul. 8, 2025

(54) DELAY CALIBRATION CIRCUIT AND DELAY CALIBRATION METHOD THEREOF

(71) Applicant: Nuvoton Technology Corporation, Hsinchu Science Park (TW)

(72) Inventors: Cheng-Chung Chou, Hsinchu Science Park (TW); Tu-Hsiu Wang, Hsinchu Science Park (TW); Cheng-Tao Li, Hsinchu Science Park (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 83 days.

(21) Appl. No.: 18/401,470

(22) Filed: Dec. 30, 2023

(65) Prior Publication Data

US 2025/0047270 A1   Feb. 6, 2025

(30) Foreign Application Priority Data

Jul. 28, 2023   (TW) .................................. 112128265

(51) Int. Cl.
| | |
|---|---|
| *H03K 5/14* | (2014.01) |
| *H03K 3/037* | (2006.01) |
| *H03K 19/173* | (2006.01) |
| *H03L 7/081* | (2006.01) |

(52) U.S. Cl.
CPC .............. *H03K 5/14* (2013.01); *H03K 3/037* (2013.01); *H03K 19/1737* (2013.01); *H03L 7/0816* (2013.01)

(58) Field of Classification Search
CPC ............ H03K 5/14; H03K 5/13; H03K 5/133; H03K 5/134; H03L 7/0812; H03L 7/081; H03L 7/0816; H03L 7/0818
See application file for complete search history.

(56) References Cited

U.S. PATENT DOCUMENTS

| | | | | |
|---|---|---|---|---|
| 10,965,293 | B1 * | 3/2021 | Chang | ...................... H03L 7/104 |
| 11,804,830 | B2 * | 10/2023 | Lan | ........................ H03K 5/1252 |
| 2007/0285180 | A1 * | 12/2007 | Wu | ........................ H03L 7/0995 |
| | | | | 331/57 |

FOREIGN PATENT DOCUMENTS

CN   106341126 B   12/2019

OTHER PUBLICATIONS

Office Action (with Search Report) issued in corresponding TW application No. 112128265 dated Aug. 23, 2024 (6 pages).

\* cited by examiner

*Primary Examiner* — Diana J. Cheng
(74) *Attorney, Agent, or Firm* — MUNCY, GEISSLER, OLDS & LOWE, P.C.

(57) ABSTRACT

A delay calibration circuit includes a first delay chain, a second delay chain, and a calibration circuit. The first delay chain includes a plurality of first delay units and delays a clock signal with a first delay to generate a first delay signal. The supply current for each of the first delay units is a first current. The second delay chain includes a plurality of second delay units and a third delay unit. The second delay units delay a first signal with a second delay to generate a second delay signal. The third delay unit delays the second delay signal to generate the third delay signal. The supply current for each unit in the second delay chain is a second current. The calibration circuit adjusts a current ratio of the second current to the first current based on the second delay signal and the third delay signal.

20 Claims, 5 Drawing Sheets

DELAY CALIBRATION CIRCUIT AND DELAY CALIBRATION METHOD THEREOF

CROSS REFERENCE TO RELATED APPLICATIONS

This Application claims priority of Taiwan Patent Application No. 112128265, filed on Jul. 28, 2023, the entirety of which is incorporated by reference herein.

BACKGROUND OF THE INVENTION

Field of the Invention

The present invention is generally related to a delay calibration circuit and a delay calibration method thereof, and more particularly it is related to a delay calibration circuit and a delay calibration method thereof for duplicating the delay time of a delay-locked loop to an open-circuit delay chain.

Description of the Related Art

Today's digitally-controlled pulse-width modulation applications require finer pulse-width control capability and precision. However, due to the limitation that the basic frequency of the system is not high enough, the pulse-width adjustment of the pulse-width modulation can only be fine-tuned to the basic duty cycle (that is, the reciprocal of the basic frequency), so a delay-locked loop (DLL) was developed to provide a delay time that is shorter than the length of the basic duty cycle (that is, the reciprocal of the basic frequency). By copying the control signal for the delay-locked loop to control an open-loop delay chain and performing logic operations on the signal waveforms prior to and posterior to the delay chain, the width of the pulse-width modulation signal may be more finely controlled.

However, the characteristics of the delay time of the open-loop delay chain still vary, with inconsistencies in temperature, voltage, and processing, and somewhat different from the delay time of the delay chain controlled by the delay-locked loop. Therefore, it is necessary to optimize the method of copying the delay time of the delay chain controlled by the delay-locked loop to another open-loop delay chain.

BRIEF SUMMARY OF THE INVENTION

The present invention proposes a delay calibration circuit and a delay calibration method. The delay time of the last two stages of the second delay chain that is an open-circuit is compared with the delay time of the first delay chain of the delay-locked loop to adjust the current ratio of the supply currents, so that the delay time of the first delay chain is copied to the second delay chain. Regardless of the delay difference being caused by voltage, temperature, and the manufacturing process, it can be calibrated through the delay calibration circuit and the delay calibration method proposed by the present invention.

In an embodiment, a delay calibration circuit is provided, which comprises a delay-locked loop, a first delay chain, a second delay chain, and a calibration circuit. The delay-locked loop generates a first current and a second current based on a clock signal, a first delay signal, and a current ratio of the second current to the first current. The first delay chain comprises a plurality of first delay units and generates the first delay signal by delaying the clock signal by a first delay time. The supply current for each of the plurality of first delay units is the first current. The second delay chain comprises a plurality of second delay units and a third delay unit. The second delay units delay a first signal by a second delay time to generate a second delay signal. The third delay unit delays the second delay signal to generate a third delay signal. A supply current for each of the second delay units and the third delay unit is the second current. A number of the plurality of first delay units is the same as a number of the plurality of second delay units. The calibration circuit adjusts the current ratio of the second current to the first current based on the second delay signal and the third delay signal, to make the second delay time is close to the first delay time.

According to an embodiment of the invention, the clock signal has a cycle period. The first delay time is equal to the cycle period.

According to an embodiment of the invention, the calibration circuit comprises a first D-type flip flop, a second D-type flip flop, and an adjustment circuit. The first D-type flip flop samples the second delay signal by using an edge of a second signal to generate a first sampling signal. The second D-type flip flop samples the third delay signal by using an edge of the second signal to generate a second sampling signal. The adjustment circuit adjusts the current ratio based on the first sampling signal and the second sampling signal.

According to an embodiment of the invention, the second signal is generated by the first signal being delayed by the first delay time.

According to an embodiment of the invention, the calibration circuit further comprises a third D-type flip flop. The third D-type flip flop samples the first signal by using the edge of the clock signal to generate the second signal.

According to an embodiment of the invention, when the first sampling signal and the second sampling signal are both in a first logic level, the adjustment circuit increases the current ratio. When the first sampling signal and the second sampling signal are both in a second logic level, the adjustment circuit decrease the current ratio. When the first sampling signal is in the first logic level and the second sampling signal is in the second logic level, the adjustment circuit maintains the current ratio.

According to an embodiment of the invention, the delay calibration circuit further comprises a first multiplexer and a register. The first multiplexer provides one of the clock signal and the first signal to the second delay chain. The register is configured to store the current ratio. When the first multiplexer provides the clock signal to the second delay chain, the adjustment circuit determines the current ratio based on the first sampling signal and the second sampling signal and stores the determined current ratio in the register. When the first multiplexer provides the first signal to the second delay chain, the delay-locked loop generates the first current and the second current based on the current ratio stored in the register.

According to an embodiment of the invention, the delay-locked loop comprises a phase detector, a charge pump, and a current source. The phase detector compares a phase of the clock signal with a phase of the first delay signal to generate a control signal. The charge pump generates a control voltage based on the control signal. The current source generates the first current and the second current based on the control voltage.

According to an embodiment of the invention, the current source comprises a first P-type transistor, a second P-type transistor, a third P-type transistor, a resistor, and a first N-type transistor. The first P-type transistor is coupled between a supply voltage and a first node, and controlled by the first node, wherein a reference current flows through the first node. The second P-type transistor forms a first current mirror with the first P-type transistor to generate the first current, wherein the first current mirror has a first mapping ratio, so that a ratio of the second current to the reference current is the second mapping ratio. The third P-type transistor forms a second current mirror with the first P-type transistor to generate the second current. The second current mirror has a second mapping ratio, so that a ratio of the second current to the reference current is the second mapping ratio. The resistor is coupled to a ground terminal. The first N-type transistor is coupled between the first node and the resistor and controls the reference current based on the control voltage.

According to an embodiment of the invention, the calibration circuit generates a first calibration signal to control the second mapping ratio of the second current mirror. When the calibration circuit increases the current ratio, the calibration circuit increases the second mapping ratio by using the first calibration signal. When the calibration circuit decreases the current ratio, the calibration circuit decreases the second mapping ratio by using the first calibration signal.

According to an embodiment of the invention, the calibration circuit further generates a second calibration signal to control the first mapping ratio of the first current mirror. When the calibration circuit increases the current ratio, the calibration circuit increases the second mapping ratio by using the first calibration signal and decreases the first mapping ratio by using the second calibration signal. When the calibration circuit decreases the current ratio, the calibration circuit decreases the second mapping ratio by using the first calibration signal and increases the first mapping ratio by using the second calibration signal.

In another embodiment, a delay calibration method is provided, which comprises the following steps. A first current and a second current are generated based on a clock signal, a first delay signal, and a current ratio of the second current to the first current. A first delay chain is provided. The first delay chain comprises a plurality of first delay units, and a supply current for each of the first delay units is the first current. The clock signal is delayed by a first delay time via the first delay chain to generate the first delay signal. A second delay chain is provided. The second delay chain comprises a plurality of second delay units and a third delay unit. A supply current for each of the second delay units and the third delay unit is the second current. A first signal is delayed by a second delay time to generate a second delay signal by the second delay units. The second delay signal is delayed to generate a third delay signal by the third delay unit. The current ratio is adjusted based on the second delay signal and the third delay signal, to make the second delay time close to the first delay time. A number of the second delay units and a number of the first delay units are the same.

According to an embodiment of the invention, the clock signal has a cycle period. The first delay time is equal to the cycle period.

According to an embodiment of the invention, the step of adjusting the current ratio based on the second delay signal and the third delay signal further comprises the following steps. The second delay signal is sampled by using an edge of a second signal to generate a first sampling signal. The third delay signal is sampled by using an edge of the second signal to generate a second sampling signal. The current ratio is adjusted based on the first sampling signal and the second sampling signal.

According to an embodiment of the invention, the second signal is generated by delaying the first signal by the first delay time.

According to an embodiment of the invention, the step of adjusting the current ratio based on the second delay signal and the third delay signal further comprises the following steps. The first signal is sampled by using an edge of the clock signal to generate the second signal.

According to an embodiment of the invention, the step of adjusting the current ratio based on the second delay signal and the third delay signal further comprises the following steps. When the first sampling signal and the second sampling signal are both in a first logic level, the current ratio is increased. When the first sampling signal and the second sampling signal are both in a second logic level, the current ratio is decreased. When the first sampling signal is in the first logic level and the second sampling signal is in the second logic level, the current ratio is maintained.

According to an embodiment of the invention, the delay calibration method further comprises the following steps. Either the clock signal or the first signal is provided to the second delay chain. When the clock signal is provided to the second delay chain, the current ratio is determined based on the first sampling signal and the second sampling signal. The determined current ratio is stored in a register. When the first signal is provided to the second delay chain, the first current and the second current are generated based on the current ratio stored in the register.

According to an embodiment of the invention, the step of generating the first current and the second current based on the clock signal, the first delay signal, and the current ratio further comprises the following steps. A phase of the clock signal is compared with a phase of the first delay signal to generate a control signal. A control voltage is generated based on the control signal. The first current and the second current are generated based on the control voltage.

According to an embodiment of the invention, the step of generating the first current and the second current based on the control voltage further comprises the following steps. A reference current is generated using the control voltage. The reference current is mirrored with a first mapping ratio to generate the first current by a first current mirror. The reference current is mirrored with a second mapping ratio to generate the first current by a second current mirror. The current ratio is adjusted by adjusting the first mapping ratio, the second mapping ratio, or both.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
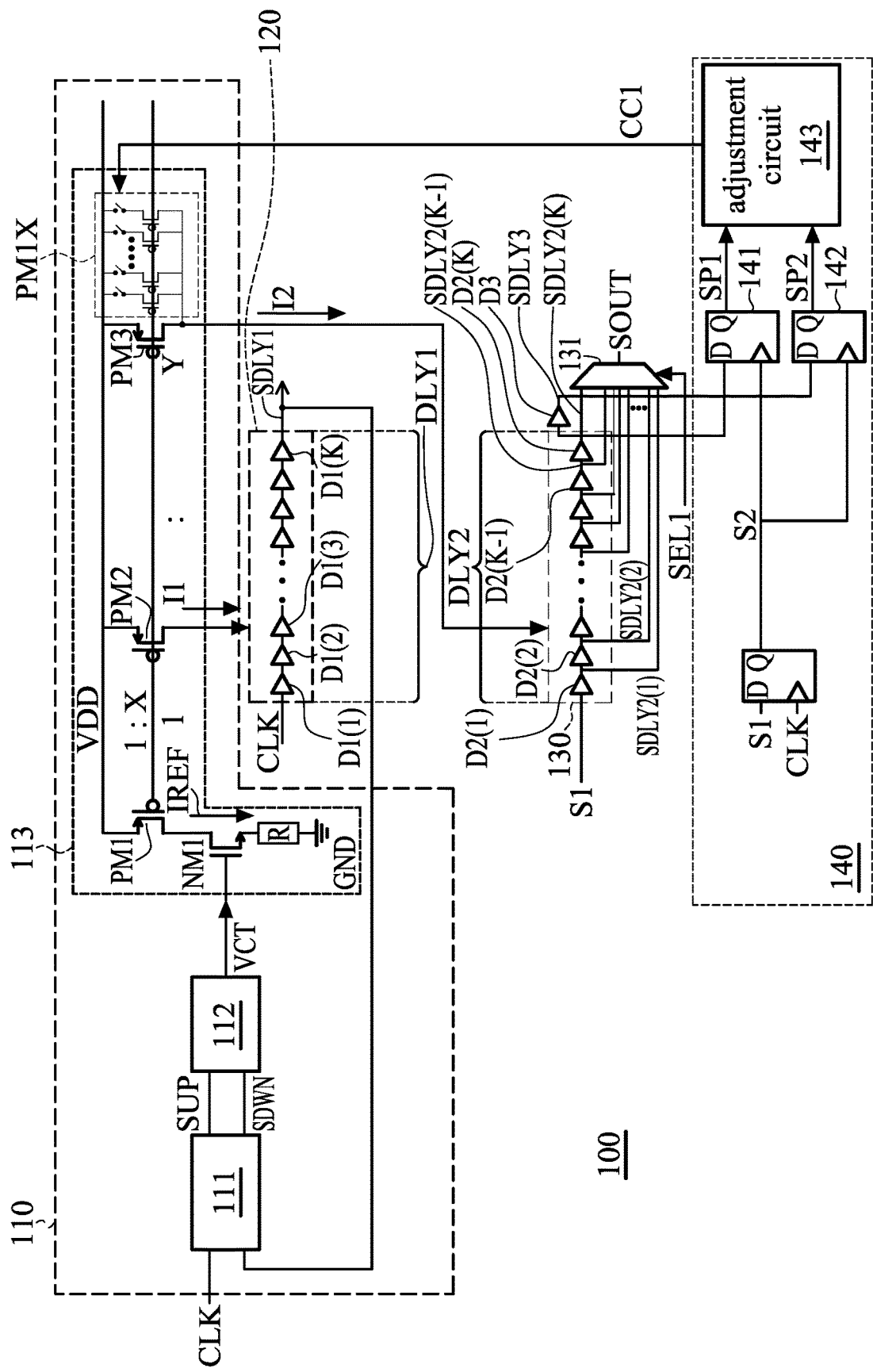
FIG. 1 is a circuit diagram showing a delay calibration circuit in accordance with an embodiment of the present invention.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "approximately", "about" and "substantially" typically mean a value is within a range of +/−20% of the stated value, more typically a range of +/−10%, +/−5%, +/−3%, +/−2%, +/−1% or +/−0.5% of the stated value. The stated value of the present disclosure is an approximate value. Even there is no specific description, the stated value still includes the meaning of "approximately", "about" or "substantially". Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

In the drawings, similar elements and/or features may have the same reference number. Various components of the same type can be distinguished by adding letters or numbers after the component symbol to distinguish similar components and/or similar features.

In addition, in some embodiments of the present disclosure, terms concerning attachments, coupling and the like, such as "connected" and "interconnected," refer to a relationship wherein structures are secured or attached to one another either directly or indirectly (for example, electrically connection) via intervening structures, as well as both movable or rigid attachments or relationships, unless expressly described otherwise.

FIG. 1 is a circuit diagram showing a delay calibration circuit in accordance with an embodiment of the present invention. As shown in FIG. 1, the delay calibration circuit 100 includes a delay-locked loop 110, a first delay chain 120, a second delay chain 130, and a calibration circuit 140. The delay-locked loop 110 generates a first current I1 and a second current I2 based on the clock signal CLK, the first delay signal SDLY1, and the first current control signal CC1.

As shown in FIG. 1, the delay-locked loop 110 includes a phase detector 111, a charge pump 112, and a current source 113. The phase detector 111 compares the phases of the clock signal CLK and the phase the first delay signal SDLY1 to generate an up signal SUP and a down signal SDWN. According to an embodiment of the present invention, the up signal SUP and the down signal SDWN are combined to form a control signal.

The charge pump 112 generates the control voltage VCT based on the control signal formed by combining the up signal SUP and the down signal SDWN. The current source 113 generates the first current I1 and the second current I2 based on the control voltage VCT. As shown in FIG. 1, the current source 113 includes a first P-type transistor PM1, a second P-type transistor PM2, a third P-type transistor PM3, a resistor R, and a first N-type transistor NM1.

The first P-type transistor PM1 is diode-connected, which is coupled between the supply voltage VDD and the first node N1. The reference current IREF flows through the first node N1. The second P-type transistor PM2 and the first P-type transistor PM1 form a first current mirror to generate a first current I1. According to an embodiment of the present invention, the first current mirror has a first mapping ratio X, so that the first current I1 is the reference current IREF multiplied by the first mapping ratio X.

The third P-type transistor PM3 and the first P-type transistor PM1 form a second current mirror to generate a second current I2. According to an embodiment of the present invention, the second current mirror has a second mapping ratio Y, so that the second current I2 is the reference current IREF multiplied by the second mapping ratio Y. The resistor R is coupled to the ground terminal GND. The first N-type transistor NM1 is coupled between the first node N1 and the resistor R, and controls the magnitude of the reference current IREF based on the control voltage VCT.

The first delay chain 120 includes a plurality of first delay units D1, which is configured to delay the clock signal CLK by a first delay time DLY1 to generate a first delay signal SDLY1. In the embodiment shown in FIG. 1, the first delay chain 120 includes the first first delay unit D1(1), the second first delay unit D1(2) . . . and the K-th first delay unit connected in series D1(K). In addition, the supply current for each of the first first delay unit D1(1), the second first delay unit D1(2) . . . and the K-th first delay unit D1(K) is the first current I1.

According to an embodiment of the present invention, the delay-locked loop 110 is configured to adjust the reference current IREF, so that the first delay signal SDLY1 is locked to one cycle period of the clock signal CLK. In other words, the first delay time DLY1 is the cycle period of the clock signal CLK.

The second delay chain 130 includes a plurality of second delay units D2 and a third delay unit D3, which delay the first signal S1 for a second delay time DLY2 to generate a K-th second delayed signal SDLY2(K). In the embodiment shown in FIG. 1, the second delay chain 130 includes the first second delay unit D2(1), the second second delay unit D2(2) . . . the (K-1) second delay unit D2(K-1), the K-th second delay unit D2(K), and the third delay unit D3. In other words, the number of the second delay units D2 and the number of the first delay units D1 are the same. According to an embodiment of the present invention, the structures of the first delay units D1, the second delay units D2, and the third delay unit D3 are the same.

In addition, the supply current for each of the first second delay unit D2(1), the second second delay unit D2(2) . . . the K-th second delay unit D2(K), and the third delay unit D3 is the second current I2. As shown in FIG. 1, the output signals of the first second delay unit D2(1), the second second delay unit D2(2) . . . and the K-th second delay unit D2(K) are the first second delay signal SDLY2(1), second second delay signal SDLY2(2) . . . (K-1)-th second delay signal SDLY2(K-1), and K-th second delay signal SDLY2 (K) respectively, and the output signal of the delay unit D3 is the third delay signal SDLY3.

According to an embodiment of the present invention, the delay calibration circuit 100 further includes a first multiplexer 131, where the first multiplexer 131 outputs one of the first second delay signals SDLY2(1), the second second delayed signal SDLY2(2), . . . , the (K-1) th second delayed signal SDLY2(K-1), and the K-th second delayed signal SDLY2(K) based on the first selection signal SEL1 as the output signal SOUT. Since the first second delay unit D2(1), the second second delay unit D2(2) . . . and the K-th second delay unit D2(K) are all the same, the delay time of the first second delay signal SDLY2(1), the second second delay signal SDLY2(2) . . . the (K-1) second delay signal SDLY2 (K-1), and the K-th second delay signal SDLY2(K) and the first signal S1 is expressed as Eq. 1:

$$\frac{n}{K} \times DLY2, n = 1, 2, \ldots, (K-1), K \quad \text{(Eq. 1)}$$

The calibration circuit 140 includes a first D-type flip flop 141, a second D-type flip flop 142, and an adjustment circuit 143. The first D-type flip flop 141 uses the edge of the second signal S2 to sample the K-th second delay signal SDLY2(K), so as to generate the first sampling signal SP1. The second D-type flip flop 142 uses the edge of the second signal S2 to sample the third delayed signal SDLY3, so as to generate the second sampled signal SP2. The adjustment circuit 143 adjusts the ratio of the second mapping ratio Y to the first mapping ratio X based on the first sampling signal SP1 and the second sampling signal SP2.

According to other embodiments of the present invention, the first D-type flip flop 141 can use the edge of the second signal S2 to sample the (K-1) second delay signal SDLY2 (K-1), and the second D-type The flip flop 142 uses the edge of the second signal S2 to sample the K-th second delay signal SDLY2(K), so that the adjustment circuit 143 adjusts the ratio of the second mapping ratio Y to the first mapping ratio X based on the first sampling signal SP1 and the second sampling signal SP2.

According to an embodiment of the present invention, the current source 113 further includes a first trimming circuit PM1X, where the first trimming circuit PM1X and the third P-type transistor PM3 are electrically connected in parallel, and the first trimming circuit PM1X and the third P-type transistor PM3 adjust the second current I2 based on the first current control signal CC1. The adjustment circuit 143 generates a first current control signal CC1 based on the first sampling signal SP1 and the second sampling signal SP2, and is configured to control the first trimming circuit PM1X to adjust the second current I2, thereby adjusting the ratio of the second mapping ratio Y to the first mapping ratio X. In other words, the adjustment circuit 143 affects the current ratio of the second current I2 to the first current I1 by adjusting the second mapping ratio Y, so that the second delay time DLY2 is close to the first delay time DLY1.

According to some embodiments of the present invention, the second signal S2 is generated by the first delay time DLY1 delaying with the first signal S1. According to some embodiments of the present invention, since the first delay time DLY1 is the cycle period of the clock signal CLK, the second signal S2 can also be regarded as the result of the first signal S1 being delayed by the cycle period of the clock signal CLK. When sampling the K-th second delay signal SDLY2(K) and the third delayed signal SDLY3 by using the second signal S2, the adjustment circuit 143 can know the relationship between the second delay time DLY2 and the first delay time DLY1 based on the first sampling signal SP1 and the second sampling signal SP2, so as to adjust the current ratio of the second current I2 to the first current I1 by adjusting the second mapping ratio Y.

According to an embodiment of the present invention, the calibration circuit 140 further includes a third D-type flip flop 144. The third D-type flip flop 144 uses the edge of the clock signal CLK to sample the first signal S1, so as to generate the second signal S2. In other words, the third D-type flip flop 144 is configured to delay the first signal S1 by the cycle period of the clock signal CLK to generate the second signal S2.

Figure 2:
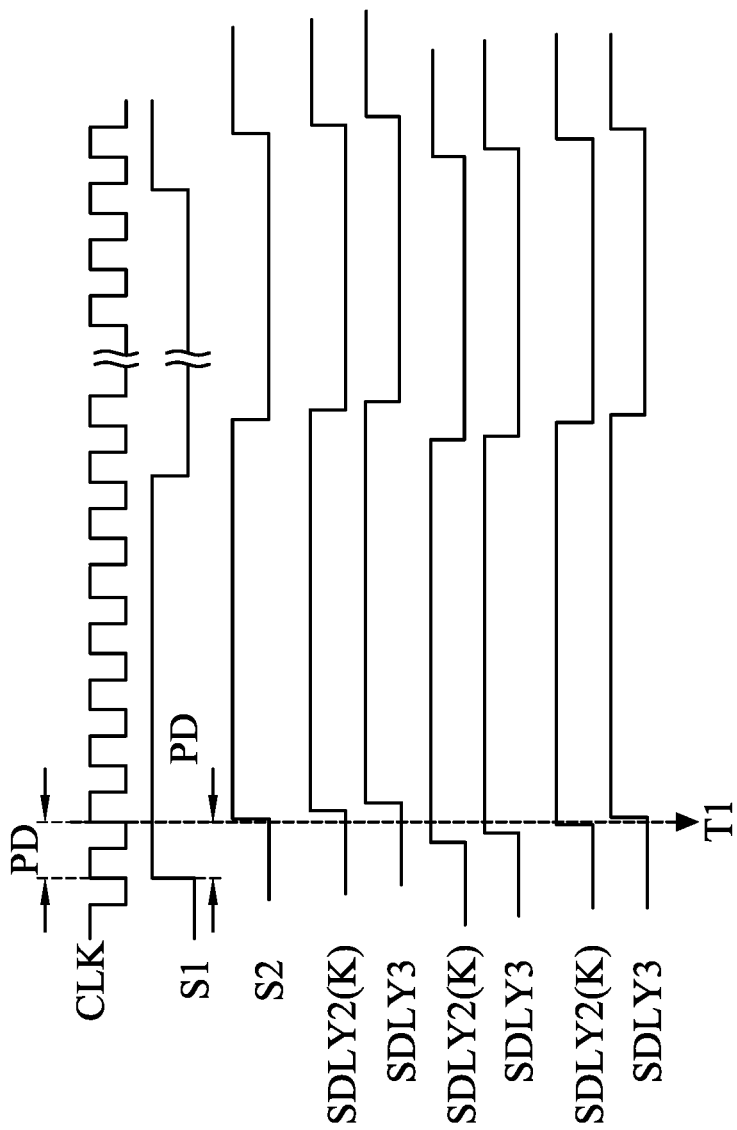
FIG. 2 shows a waveform diagram of a calibration circuit in accordance with an embodiment of the present invention.

FIG. 2 shows a waveform diagram of a calibration circuit in accordance with an embodiment of the present invention. As shown in FIG. 2, the third D-type flip flop 144 uses the clock signal CLK to sample the first signal S1 at the first time T1, and the second signal S2 is generated by the first signal S1 delaying with the cycle period PD of the clock signal CLK for. In addition, the first D-type flip flop 141 and the second D-type flip flop 142 also use the second signal S2 to sample the K-th second delayed signal SDLY2(K) and the third delayed signal SDLY3 respectively at the first time T1.

According to one embodiment of the present invention, when the K-th second delay signal SDLY2(K) and the third delay signal SDLY3 sampled by the first D-type flip flop 141 and the second D-type flip flop 142 respectively at the first time T1 are both at a low logic level, it indicates that the second delay time DLY2 is greater than the first delay time DLY1 (that is, the cycle period PD of the clock signal CLK). Therefore, the adjustment circuit 143 uses the first current control signal CC1 to increase the second mapping ratio Y, so that the second current I2 increases to decrease the second delay time DLY2.

According to another embodiment of the present invention, when the K-th second delay signal SDLY2 (K) and the third When the delay signal SDLY3 sampled by the first D-type flip flop 141 and the second D-type flip flop 142 respectively at the first time T1 are both at a high logic level, it indicates that the second delay time DLY2 is less than the first delay time DLY1 (that is, the cycle period PD of the clock signal CLK). Therefore, the adjustment circuit 143 uses the first current control signal CC1 to reduce the second mapping ratio Y, so that the second current I2 decreases to increase the second delay time DLY2.

According to another embodiment of the present invention, when the K-th second delay signal SDLY2 (K) sampled by the first D-type flip flop 141 is at a high logic level and the three-delay signal SDLY3 sampled by the second D-type flip flop 142 is at a low logic level, it indicates that the second delay time DLY2 is close to the first delay time DLY1 (that is, the cycle period PD of the clock signal CLK). Therefore, the adjustment circuit 143 maintains the second mapping ratio Y without adjusting the current ratio of the second current I2 to the first current I1.

According to an embodiment of the present invention, when the number of the second delay units D2 (that is, the number of the first delay unit D1) is more, the difference of the first delay time DLY1 and the second delay time DLY2 is less after the calibration circuit 140 calibrates. In other words, the more the second delay units D2 are connected in series, the closer the second delay time DLY2 is to the cycle period PD of the clock signal CLK after the calibration circuit 140 calibrates.

Figure 3:
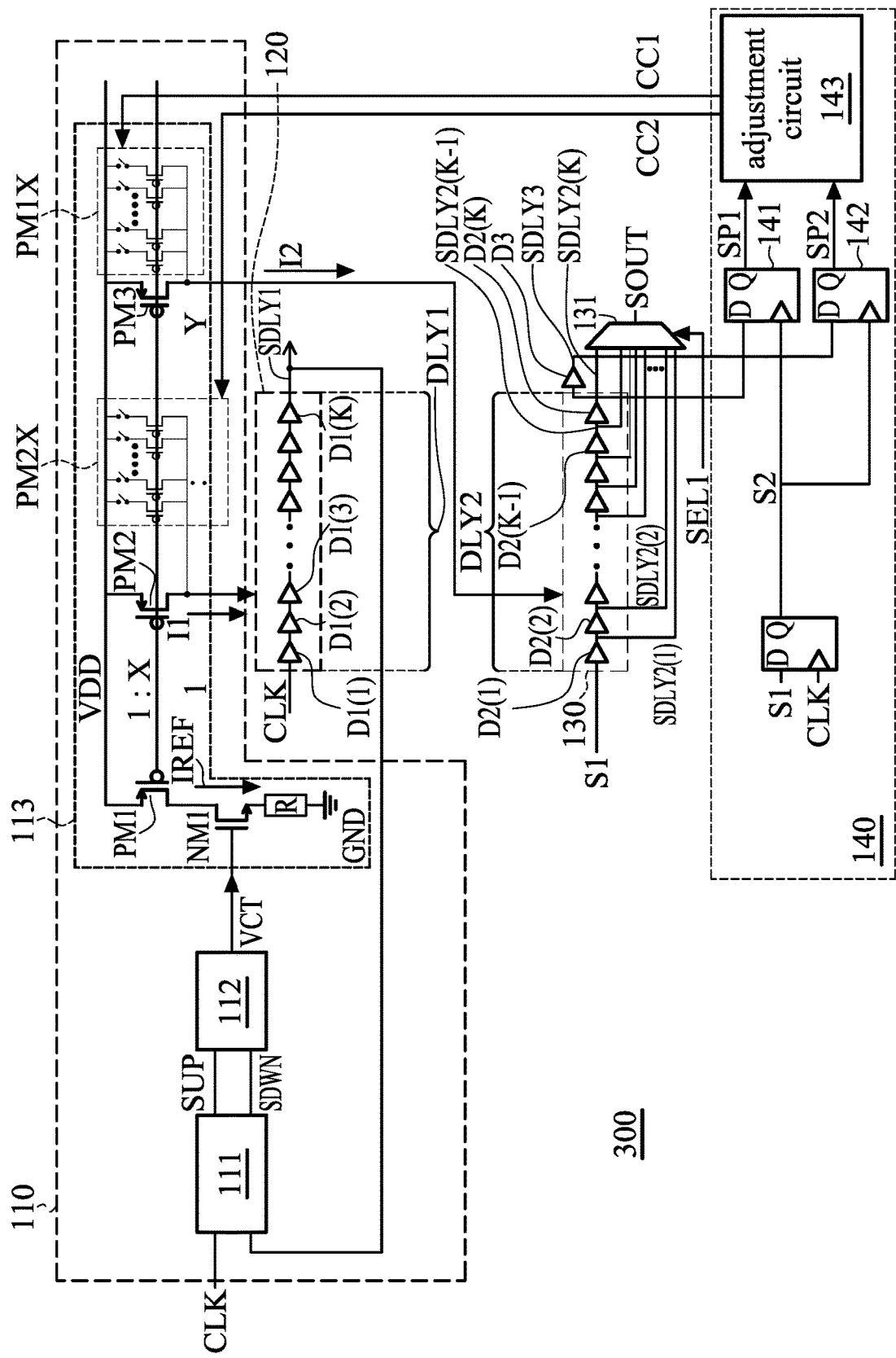
FIG. 3 is a circuit diagram showing a delay calibration circuit in accordance with another embodiment of the present invention.

FIG. 3 is a circuit diagram showing a delay calibration circuit in accordance with another embodiment of the present invention. Comparing the delay calibration circuit 300 in FIG. 3 with the delay calibration circuit 100 in FIG. 1, the delay calibration circuit 300 further includes a second trimming circuit PM2X. The second trimming circuit PM2X and the second P-type transistor PM2 are connected in parallel, and the second trimming circuit PM2X adjusts the first current I1 based on the second current control signal CC2.

According to some embodiments of the present invention, when the adjustment circuit 143 determines that the current ratio of the second current I2 to the first current I1 needs to be adjusted based on the first sampling signal SP1 and the second sampling signal SP2, the adjustment circuit 143 not only adjusts the second mapping ratio Y by using the first current control signal CC1, but also adjusts the first mapping ratio X by using the second current control signal CC2, thereby adjusting the current ratio of the second current I2 to the first current I1 to a greater extent.

According to an embodiment of the present invention, when the K-th second delay signal SDLY2(K) and the third delay signal SDLY3 sampled by the first D-type flip flop 141 and the second D-type flip flop 142 at the first time T1 are both at a low logic level, it indicates that the second delay time DLY2 is greater than the first delay time DLY1 (that is, the cycle period PD of the clock signal CLK). Therefore, the adjustment circuit 143 uses the first current control signal CC1 to increase the second mapping ratio Y and uses the second current control signal CC2 to reduce the first mapping ratio X, so as to reduce the second delay time DLY2.

According to another embodiment of the present invention, when the K-th second delay signal SDLY2(K) and the third When the delay signal SDLY3 sampled by the first D-type flip flop 141 and the second D-type flip flop 142 at the first time T1 are both at a high logic level, it indicates that the second delay time DLY2 is less than the first delay time DLY1 (that is, the cycle period PD of the clock signal CLK). Therefore, the adjustment circuit 143 uses the first current control signal CC1 to reduce the second mapping ratio Y and uses the second current control signal CC2 to increase the first mapping ratio X, so as to increase the second delay time DLY2.

According to another embodiment of the present invention, when the K-th second delay signal SDLY2 (K) sampled by the first D-type flip flop 141 is at a high logic level and the three-delay signal SDLY3 sampled by the second D-type flip flop 142 is at a low logic level, it indicates that the second delay time DLY2 is close to the first delay time DLY1 (that is, the cycle period PD of the clock signal CLK). Therefore, the adjustment circuit 143 maintains the first mapping ratio X and the second mapping ratio Y, so as to maintain the current ratio of the second current I2 to the first current I1.

Figure 4:
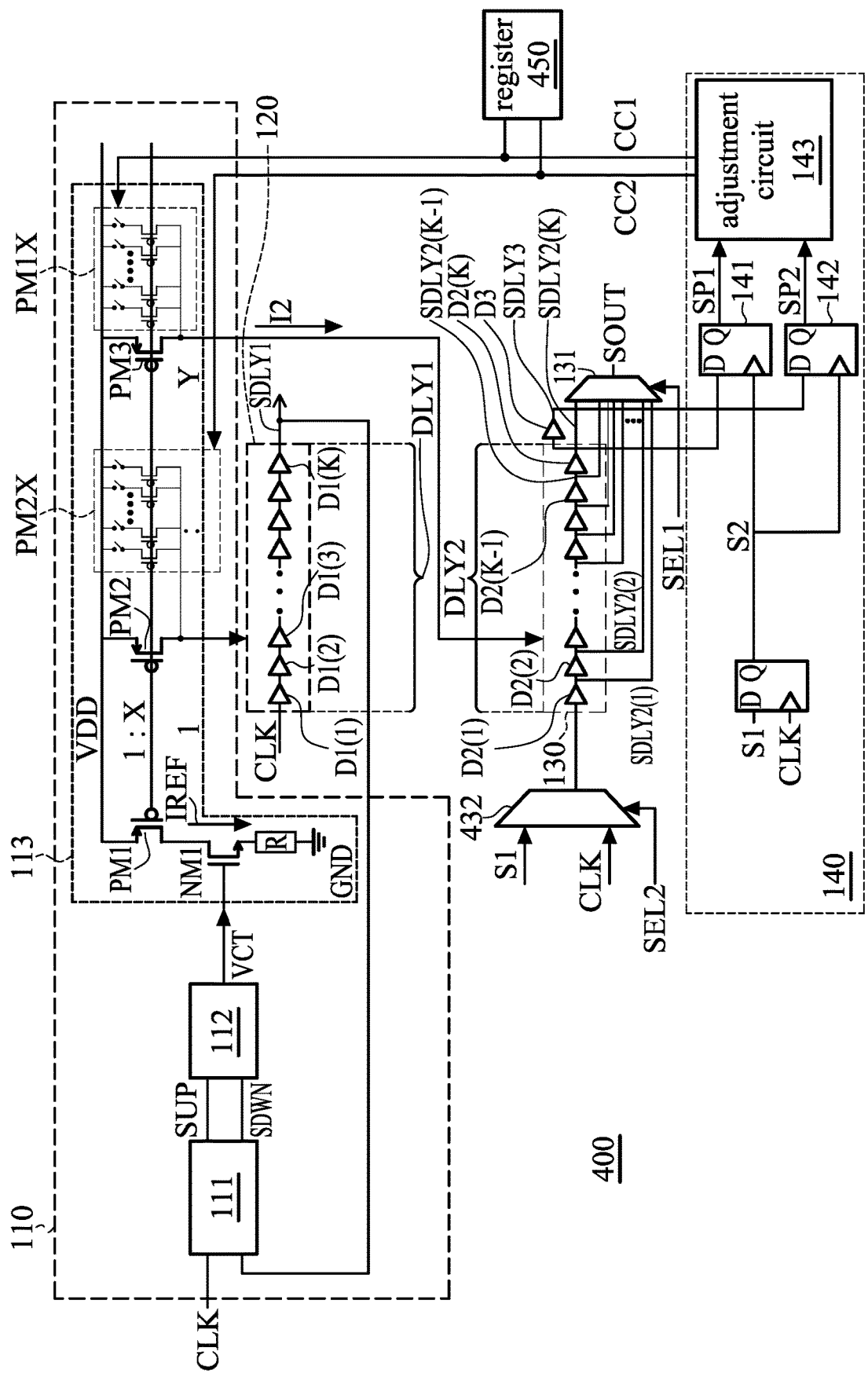
FIG. 4 is a circuit diagram showing a delay calibration circuit in accordance with another embodiment of the present invention.

FIG. 4 is a circuit diagram showing a delay calibration circuit in accordance with another embodiment of the present invention. Comparing the delay calibration circuit 400 in FIG. 4 with the delay calibration circuit 100 in FIG. 1, the delay calibration circuit 400 further includes a second multiplexer 432 and a register 450.

The second multiplexer 432 provides one of the clock signal CLK and the first signal S1 to the second delay chain 130 based on the second selection signal SEL2. The register 450 is configured to store the first current control signal CC1 and the second current control signal CC2 generated by the adjustment circuit 143. In other words, the register 450 is configured to store the current ratio of the second current I2 to the first current I1.

According to an embodiment of the present invention, when the second multiplexer 432 provides the clock signal CLK to the second delay chain 130 based on the second selection signal SEL2, the adjustment circuit 143 adjusts the current ratio of the second current I2 and the first current I1 by the first current control signal CC1 and the second current control signal CC2, so that the second delay time DLY2 is close to the first delay time DLY1 (i.e., the cycle period PD of the clock signal CLK). Then, the first current control signal CC1 and the second current control signal CC2 that make the second delay time DLY2 approximate to the first delay time DLY1 are stored in the register 450.

According to another embodiment of the present invention, when the second multiplexer 432 provides the second signal S2 to the second delay chain 130 based on the second selection signal SEL2, the calibration circuit 140 stops operating, and the first trimming circuit PM1X and the second trimming circuit PM2X operate based on the first current control signal CC1 and the second current control signal CC2 stored in the register 450 respectively, so that the second delay time DLY2 is close to the first delay time DLY1.

In other words, with the second multiplexer 432 and the register 450, the delay calibration circuit 400 may calibrate in the idle time before the first signal S1 is received, and stores the calibrated first current control signal CC1 and second current control signal CC2 in the register 450. When the second delay chain 130 receives the first signal S1, the first current control signal CC1 and the second current control signal CC2 stored in the register 450 can be directly used to control the first trimming circuit PM1X and the second trimming circuit PM2X.

In addition, with the second multiplexer 432 and the register 450, the operating frequency of the calibration circuit 140 can be reduced, thereby reducing power consumption and also reducing the waiting time for other circuits during the calibration circuit 140 calibrating.

Figure 5:
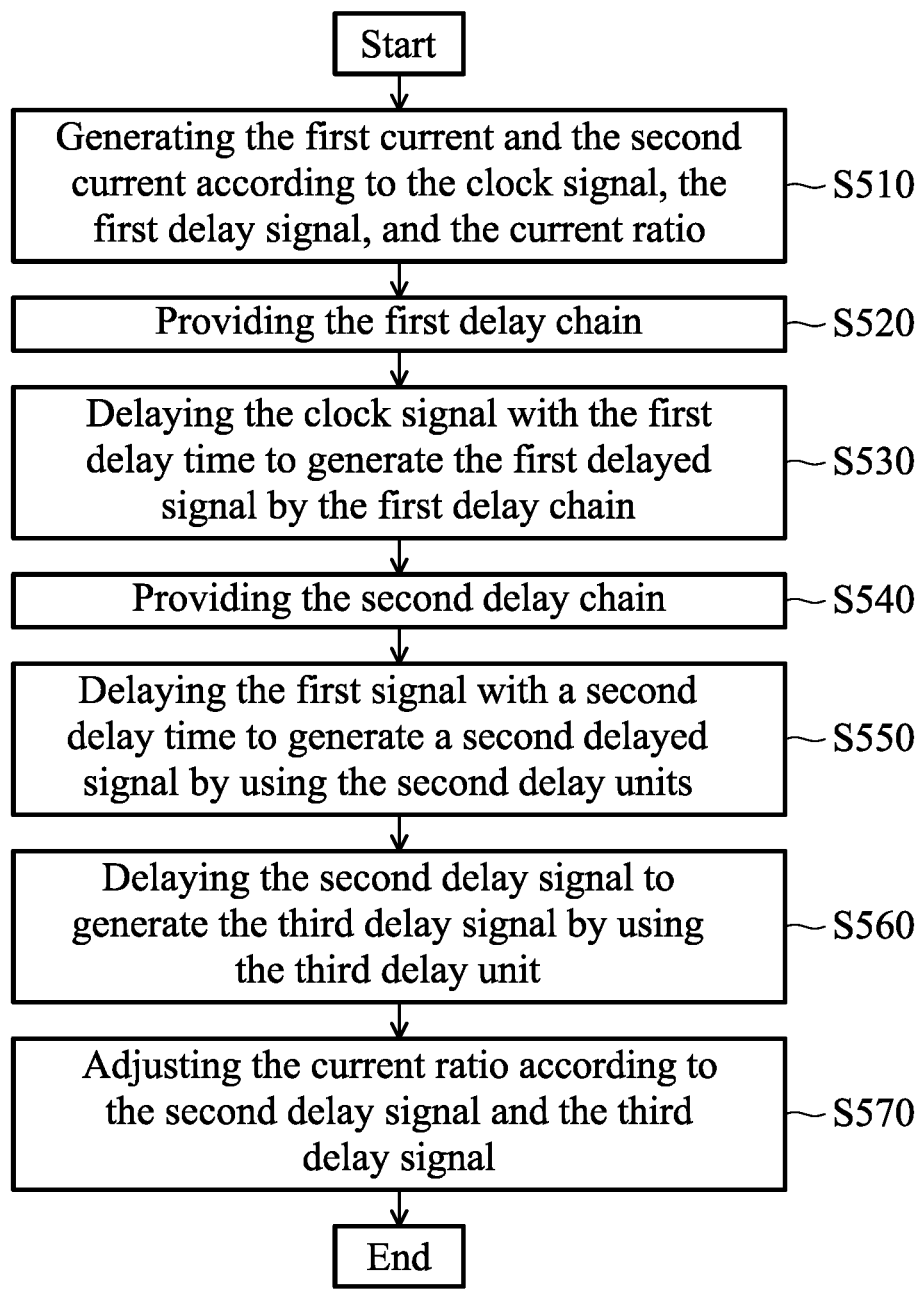
FIG. 5 is a flow chart showing a delay calibration method in accordance with an embodiment of the present invention.

FIG. 5 is a flow chart showing a delay calibration method in accordance with an embodiment of the present invention. The following description of the delay calibration method 500 will be described in detail with the delay calibration device 100 in FIG. 1.

First, the delay-locked loop 110 generates the first current I1 and the second current I2 based on the clock signal CLK, the first delay signal SDLY1, and the current ratio of the second current I2 to the first current I1 (Step S510). According to an embodiment of the present invention, in the embodiment shown in FIG. 1, the current ratio of the second current I2 to the first current I1 is determined by the first current control signal CC1. According to another embodiment of the present invention, in the embodiment shown in FIG. 3, the current ratio of the second current I2 to the first current I1 is determined by the first current control signal CC1 and the second current control signal CC2.

Next, the first delay chain 120 is provided (Step S520). According to an embodiment of the present invention, the first delay chain 120 includes a plurality of first delay units D1, where the supply current for each of the first delay units D1 is the first current I1. The clock signal CLK is delayed by the first delay time DLY1 to generate the first delayed signal SDLY1 via the first delay chain 120 (Step S530). According to an embodiment of the present invention, through the control of the delay-locked loop 110, the first delay time DLY1 is equal to the cycle period PD of the clock signal CLK.

The second delay chain 130 is provided (Step S540). According to an embodiment of the present invention, the second delay chain 130 includes a plurality of second delay units D2 and a third delay unit D3, where the supply current for each of the second delay units D2 and the third delay unit D3 is the second current I2.

The first signal S1 is delayed by a second delay time DLY2 to generate a second delayed signal SDLY2 by using the second delay units D2 (Step S550). In the embodiment shown in FIG. 1, the first second delay unit D2(1), the second second delay unit D2(2) . . . the (K-1)-th second delay unit D2(K-1), and the K-th second delay unit D2 (K) delay the first signal S1 with a second delay time DLY2 to generate a second delay signal SDLY2. According to an embodiment of the present invention, the number of the second delay units D2 is equal to the number of the first delay units D1.

By using the third delay unit D3, the second delay signal SDLY2 is delayed to generate the third delay signal SDLY3 (Step S560). In the embodiment shown in FIG. 1, the third delay unit D3 delays the K-th second delayed signal SDLY2 (K) to generate a third delayed signal SDLY3.

The calibration circuit 140 adjusts the current ratio of the second current I2 to the first current I1 based on the second delay signal SDLY2 and the third delay signal SDLY3 (Step S570), so that the second delay time DLY2 is equal to the first delay time DLY1. In the embodiment shown in FIG. 1, the calibration circuit 140 adjusts the second mapping ratio Y based on the K-th second delay signal SDLY2 (K) and the third delay signal SDLY3, thereby adjusting the current ratio of the second current I2 to the first current I1. In the embodiment shown in FIG. 3, the calibration circuit 140 can adjust the first mapping ratio X and the second mapping ratio Y, thereby adjusting the current ratio of the second current I2 to the first current I1.

According to other embodiments of the present invention, the calibration circuit 140 can also adjust the ratio of the second current I2 to the first current I1 based on the (k-1)-th second delay signal SDLY2 (k-1) and the k-th second delay signal SDLY2 (k), and the second delay time DLY2 may be slightly less than the first delay time DLY1. On the other hand, when the calibration circuit 140 adjusts the current ratio based on the second delay signal SDLY2 and the third delay signal SDLY3, the second delay time DLY2 may be slightly greater than the first delay time DLY1.

According to one embodiment of the present invention, as shown in FIG. 3, when the K-th second delayed signal SDLY2(K) and the third delay signal SDLY3 sampled by the first D-type flip flop 141 and the second D-type flip flop 142 at the first time T1 both are at a low logic level, it indicates that the second delay time DLY2 is greater than the first delay time DLY1 (that is, the cycle period PD of the clock signal CLK), so the adjustment circuit 143 increases the ratio of the second current I2 to the first current I1 to reduce the second delay time DLY2.

According to another embodiment of the present invention, as shown in FIG. 3, when the K-th second delayed signal SDLY2(K) and the third delay signal SDLY3 sampled by the first D-type flip flop 141 and the second D-type flip flop 142 at the first time T1 both are at a high logic level, it indicates that the second delay time DLY2 is less than the first delay time DLY1 (that is, the cycle period PD of the clock signal CLK). Therefore, the adjustment circuit 143 reduces the current ratio of the second current I2 to the first current I1 to increase the second delay time DLY2.

According to another embodiment of the present invention, as shown in FIG. 3, when the K-th second delay signal SDLY2 (K) sampled by the first D-type flip flop 141 is at a high logic level and the third delay signal SDLY3 sampled by the second D-type the flip flop 142 is at a low logic level, it indicates that the second delay time DLY2 is close to the first delay time DLY1 (that is, the cycle period PD of the clock signal CLK). Therefore, the adjustment circuit 143 maintains the current ratio of the second current I2 to the first current I1.

The present invention proposes a delay calibration circuit and a delay calibration method. The delay time of the last two stages of the second delay chain that is an open-circuit is compared with the delay time of the first delay chain of the delay-locked loop to adjust the current ratio of the supply currents, so that the delay time of the first delay chain is copied to the second delay chain. Regardless of the delay difference being caused by voltage, temperature, and the manufacturing process, it can be calibrated through the delay calibration circuit and the delay calibration method proposed by the present invention.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A delay calibration circuit, comprising:
   a delay-locked loop, generating a first current and a second current based on a clock signal, a first delay signal, and a current ratio of the second current to the first current;
   a first delay chain, comprising a plurality of first delay units and generating the first delay signal by delaying the clock signal by a first delay time, wherein a supply current for each of the plurality of first delay units is the first current;
   a second delay chain, comprising:
      a plurality of second delay units, delaying a first signal by a second delay time to generate a second delay signal; and
      a third delay unit, delaying the second delay signal to generate a third delay signal;
      wherein a supply current for each of the second delay units and the third delay unit is the second current;
      wherein a number of the plurality of first delay units is the same as a number of the plurality of second delay units; and
   a calibration circuit, adjusting the current ratio of the second current to the first current based on the second delay signal and the third delay signal, to make the second delay time close to the first delay time.

2. The delay calibration circuit as defined in claim 1, wherein the clock signal has a cycle period;
   wherein the first delay time is equal to the cycle period.

3. The delay calibration circuit as defined in claim 1, wherein the calibration circuit comprises:
   a first D-type flip flop, sampling the second delay signal by using an edge of a second signal to generate a first sampling signal;
   a second D-type flip flop, sampling the third delay signal by using an edge of the second signal to generate a second sampling signal; and
   an adjustment circuit, adjusting the current ratio based on the first sampling signal and the second sampling signal.

4. The delay calibration circuit as defined in claim 3, wherein the second signal is generated by the first signal being delayed by the first delay time.

5. The delay calibration circuit as defined in claim 3, wherein the calibration circuit further comprises:
   a third D-type flip flop, sampling the first signal by using the edge of the clock signal to generate the second signal.

6. The delay calibration circuit as defined in claim 3, wherein when the first sampling signal and the second sampling signal are both in a first logic level, the adjustment circuit increases the current ratio;
   wherein when the first sampling signal and the second sampling signal are both in a second logic level, the adjustment circuit decrease the current ratio;
   wherein when the first sampling signal is in the first logic level and the second sampling signal is in the second logic level, the adjustment circuit maintains the current ratio.

7. The delay calibration circuit as defined in claim 3, further comprising:
   a first multiplexer, providing one of the clock signal and the first signal to the second delay chain; and
   a register, configured to store the current ratio;
   wherein when the first multiplexer provides the clock signal to the second delay chain, the adjustment circuit determines the current ratio based on the first sampling signal and the second sampling signal and stores the determined current ratio in the register;
   wherein when the first multiplexer provides the first signal to the second delay chain, the delay-locked loop generates the first current and the second current based on the current ratio stored in the register.

8. The delay calibration circuit as defined in claim 1, wherein the delay- locked loop comprises:
   a phase detector, comparing a phase of the clock signal with a phase of the first delay signal to generate a control signal;
   a charge pump, generating a control voltage based on the control signal; and
   a current source, generating the first current and the second current based on the control voltage.

9. The delay calibration circuit as defined in claim 8, wherein the current source comprises:
   a first P-type transistor, coupled between a supply voltage and a first node, and controlled by the first node, wherein a reference current flows through the first node;
   a second P-type transistor, forming a first current mirror with the first P-type transistor to generate the first current, wherein the first current mirror has a first mapping ratio, so that a ratio of the second current to the reference current is the second mapping ratio;
   a third P-type transistor, forming a second current mirror with the first P-type transistor to generate the second current, wherein the second current mirror has a second mapping ratio, so that a ratio of the second current to the reference current is the second mapping ratio;
   a resistor, coupled to a ground terminal; and
   a first N-type transistor, coupled between the first node and the resistor and controlling the reference current based on the control voltage.

10. The delay calibration circuit as defined in claim 9, wherein the calibration circuit generates a first calibration signal to control the second mapping ratio of the second current mirror;
    wherein when the calibration circuit increases the current ratio, the calibration circuit increases the second mapping ratio by using the first calibration signal;
    wherein when the calibration circuit decreases the current ratio, the calibration circuit decreases the second mapping ratio by using the first calibration signal.

11. The delay calibration circuit as defined in claim 10, wherein the calibration circuit further generates a second calibration signal to control the first mapping ratio of the first current mirror;
    wherein when the calibration circuit increases the current ratio, the calibration circuit increases the second mapping ratio by using the first calibration signal, and decreases the first mapping ratio by using the second calibration signal;

wherein when the calibration circuit decreases the current ratio, the calibration circuit decreases the second mapping ratio by using the first calibration signal, and increases the first mapping ratio by using the second calibration signal.

12. A delay calibration method, comprising:
generating a first current and a second current based on a clock signal, a first delay signal, and a current ratio of the second current to the first current;
providing a first delay chain, wherein the first delay chain comprises a plurality of first delay units, and a supply current for each of the plurality of first delay units is the first current;
delaying the clock signal by a first delay time via the first delay chain to generate the first delay signal;
providing a second delay chain, wherein the second delay chain comprises a plurality of second delay units and a third delay unit, and a supply current for each of the plurality of second delay units and the third delay unit is the second current;
delaying a first signal by a second delay time to generate a second delay signal, by the second delay units;
delaying the second delay signal to generate a third delay signal, by the third delay unit; and
adjusting the current ratio based on the second delay signal and the third delay signal, to make the second delay time close to the first delay time;
wherein a number of the plurality of second delay units and a number of the plurality of first delay units are the same.

13. The delay calibration method as defined in claim 12, wherein the clock signal has a cycle period;
wherein the first delay time is equal to the cycle period.

14. The delay calibration method as defined in claim 12, wherein the step of adjusting the current ratio based on the second delay signal and the third delay signal further comprises:
sampling the second delay signal by using an edge of a second signal to generate a first sampling signal;
sampling the third delay signal by using an edge of the second signal to generate a second sampling signal; and
adjusting the current ratio based on the first sampling signal and the second sampling signal.

15. The delay calibration method as defined in claim 14, wherein the second signal is generated by delaying the first signal by the first delay time.

16. The delay calibration method as defined in claim 14, wherein the step of adjusting the current ratio based on the second delay signal and the third delay signal further comprises:
sampling the first signal by using an edge of the clock signal to generate the second signal.

17. The delay calibration method as defined in claim 14, wherein the step of adjusting the current ratio based on the second delay signal and the third delay signal further comprises:
when the first sampling signal and the second sampling signal are both in a first logic level, increasing the current ratio;
when the first sampling signal and the second sampling signal are both in a second logic level, decreasing the current ratio; and
when the first sampling signal is in the first logic level and the second sampling signal is in the second logic level, maintaining the current ratio.

18. The delay calibration method as defined in claim 14, further comprising:
providing either the clock signal or the first signal to the second delay chain;
when the clock signal is provided to the second delay chain, determining the current ratio based on the first sampling signal and the second sampling signal;
storing the determined current ratio in a register; and
when the first signal is provided to the second delay chain, generating the first current and the second current based on the current ratio stored in the register.

19. The delay calibration method as defined in claim 12, wherein the step of generating the first current and the second current based on the clock signal, the first delay signal, and the current ratio further comprises:
comparing a phase of the clock signal with a phase of the first delay signal to generate a control signal;
generating a control voltage based on the control signal; and
generating the first current and the second current based on the control voltage.

20. The delay calibration method as defined in claim 19, wherein the step of generating the first current and the second current based on the control voltage further comprises:
generating a reference current using the control voltage;
mirroring the reference current with a first mapping ratio to generate the first current, by a first current mirror; and
mirroring the reference current with a second mapping ratio to generate the first current, by a second current mirror;
wherein the current ratio is adjusted by adjusting at least one of the first mapping ratio and the second mapping ratio.

* * * * *